US010158230B2

(12) United States Patent
Gupta et al.

(10) Patent No.: US 10,158,230 B2
(45) Date of Patent: Dec. 18, 2018

(54) COMPENSATING ELECTRICAL HARMONICS ON THE ELECTRICAL GRID

(71) Applicant: VESTAS WIND SYSTEMS A/S, Aarhus N (DK)

(72) Inventors: Amit Kumar Gupta, Singapore (SG); Manoj Gupta, Singapore (SG); Dilip Kumar Guru, Singapore (SG)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 226 days.

(21) Appl. No.: 14/899,694

(22) PCT Filed: Jun. 18, 2013

(86) PCT No.: PCT/DK2013/050199
§ 371 (c)(1),
(2) Date: Dec. 18, 2015

(87) PCT Pub. No.: WO2014/202077
PCT Pub. Date: Dec. 24, 2014

(65) Prior Publication Data
US 2016/0134114 A1    May 12, 2016

(51) Int. Cl.
*H02J 3/01* (2006.01)
*H02M 1/12* (2006.01)
*H02J 3/18* (2006.01)
*H02J 3/38* (2006.01)
*G01R 19/00* (2006.01)
*G01R 27/02* (2006.01)
*H02M 7/44* (2006.01)

(52) U.S. Cl.
CPC ............ *H02J 3/01* (2013.01); *G01R 19/0092* (2013.01); *G01R 27/02* (2013.01); *H02J 3/1842* (2013.01); *H02J 3/382* (2013.01); *H02J 3/383* (2013.01); *H02J 3/386* (2013.01); *H02M 1/12* (2013.01); *H02M 7/44* (2013.01); *Y02E 10/763* (2013.01); *Y02E 40/22* (2013.01)

(58) Field of Classification Search
CPC ........................................................ H02J 3/01
USPC ............................................................ 307/82
See application file for complete search history.

(56) References Cited

PUBLICATIONS

Frede Blaabjerg et al.: "Overview of Control and Grid Synchronization for Distributed Power Generation Systems", IEEE Transactions on Industrial Electronics, vol. 53, No. 5, Oct. 2006.

(Continued)

*Primary Examiner* — Joseph Chang
(74) *Attorney, Agent, or Firm* — Patterson + Sheridan, LLP

(57) ABSTRACT

The invention relates to a control system for compensating undesired electrical harmonics on an electrical grid. Part of the control system referred to as a harmonic compensator is operatively connected with a power inverter of a power producing unit supplying power to the grid. Another part of the control system, referred to as an impedance detector, is operatively connected to a point of coupling to which point one or more power producing units are connected. The impedance detector is configured to scan impedances as a function of frequency to identify frequencies of impedance peaks which peaks are indicative of resonance frequencies. The determined resonance frequencies are supplied to one or more the harmonic compensators. A compensator determines control signals to the inverter which causes the inverter to inject compensation currents to the grid which currents will damp currents oscillating at or close to the determined resonance frequency.

14 Claims, 7 Drawing Sheets

(56) References Cited

PUBLICATIONS

Md Hasan K N et al.: "Study on Harmonic Resonances and Damping in Wind Power Plant", Intelligent and Advanced Systems (ICIAS), 2012 4th International Conference on, IEEE, Jun. 12, 2012, pp. 418-423.

Pogaku et al.: "Application of Inverter-Based Distributed Generators for Harmonic Damping Throughout a Distribution Newtork", Power Electronics Specialists Conference, 2005, PESC '05, IEEE 36th IEEE, Piscataway, NJ, Jan. 1, 2005, pp. 1922-1927.

International Search Report for PCT/DK2014/050199, dated Mar. 27, 2014.

Babak Badrzadeh et al: "Power system harmonic analysis in wind power plants Part I: Study methodology and techniques", Industry Applications Society Annual Meeting (IAS), 2012 IEEE, IEEE, Oct. 7, 2012 (Oct. 7, 2012), pp. 1-11 , XP032278554, DOI: 10.1109/IAS.2012.6374102 ISBN: 978-1-4673-0330-9.

Babak Badrzadeh et al: "Power system harmonic analysis in wind power plants Part II: Practical experiences and mitigation methods", EPO Form 2906.01.91 TRI Industry Applications Society Annual Meeting (IAS), 2012 IEEE, IEEE, Oct. 7, 2012 (Oct. 7, 2012), pages.

European Patent Office Action for Application No. 13 731 670.9-1201 dated Oct. 24, 2018.

COMPENSATING ELECTRICAL HARMONICS ON THE ELECTRICAL GRID

FIELD OF THE INVENTION

The invention relates to compensating electrical harmonics on the electrical grid, particularly to controlling power converters of power generating units for compensating electrical harmonics on the electrical grid.

BACKGROUND OF THE INVENTION

The harmonic distortion at the Point of Common Coupling on the electrical grid has to be within the limits specified e.g. by a grid code specification. The harmonic distortion on the grid is caused due to variations of harmonic grid impedance due to switching of grid connected elements such as load, capacitors, reactor banks and generators of power producing units connected to the grid.

Use of passive filters for filtering undesired harmonics is possible. However, passive filters are expensive and require relatively large space.

Harmonic distortion may particularly be generated by wind turbine generators, solar power generators, hydro electric generators or generators or other power producing units.

Since harmonic grid distortion is a problem there is a need for a method for reducing harmonic distortion in connection with grid connected power producing units.

SUMMARY OF THE INVENTION

It would be advantageous to achieve improvements in methods for compensating electrical harmonics on the electrical grid. In general, the invention preferably seeks to alleviate or eliminate one or more of the above mentioned disadvantages relating to known systems for filtering undesired harmonics. In particular, it may be seen as an object of the present invention to provide a method that solves the above mentioned problems relating to harmonic grid distortion, or other problems, of the prior art.

To better address one or more of these concerns, in a first aspect of the invention a control system for compensating an electrical harmonic on an electrical grid is presented, where the electrical grid is powered by at least one power generating unit connected to a point of common coupling of the grid, which power generating unit includes a power inverter for injecting current to the grid, the control system includes,
- an impedance detector configured to determine impedance peaks by repeatedly performing a scan of the impedance at the point of common coupling over a frequency range, and configured to determine a resonance frequency from one of the determined impedance peaks, and
- a harmonic compensator configured to determine a control input to the inverter for controlling generation of active and reactive current generation by the inverter, where the control input is determined on basis of information related to the determined resonance frequency so that the current generated by the inverter is capable of compensating the electrical harmonic at the determined resonance frequency.

Advantageously, the harmonic compensator may be configured to determine control input on basis of one or more resonance frequencies so that compensation of electrical harmonics at one or more different resonance frequencies is possible.

In an embodiment the harmonic compensator includes a processor configured to determine the control input based on processing of measured currents of the inverter output, where the processing includes dq-transforming the measured currents to obtain a pair of active and reactive currents which are stationary in a dq-frame rotating with the determined resonance frequency.

In an embodiment the processor is further configured to time-integrate the dq-transformed currents which are stationary in the dq-frame rotating with the determined resonance frequency and amplify the dq-transformed currents by a control gain.

In an embodiment the processor is further configured to dq-transform the time-integrated and amplified currents back into a dq-frame rotating with a fundamental electrical frequency of the grid.

In an embodiment the impedance detector is configured to determine first and second resonance frequencies from determined first and second impedance peaks, and the harmonic compensator is configured to determine first and second control input to the inverter for controlling generation of active and reactive current generation by the inverter, where the control input are determined on basis of information related to the determined first and second resonance frequencies so that the current generated by the inverter is capable of compensating the first and second electrical harmonics at the determined first and second resonance frequencies.

In an embodiment the harmonic compensator includes first and second processors configured to determine the control input based on processing of measured currents of the inverter output, where the processing includes dq-transforming the measured currents by respective first and second dq-transforms to obtain respective first and second pairs of active and reactive currents which are stationary in dq-frames rotating with the determined respective first and second resonance frequencies.

The first and second processors need not be separate physical entities. For example, the first and second processors may include a common data processor or computer and other common data or signal processing electronics, but may have separate input and/or output terminals for receiving input signals and transmitting output signals.

In an embodiment the first and second processors are configured to time-integrate the respective first and second pairs of active and reactive currents and amplify the first and second pairs of active and reactive currents by first and second control gains.

In an embodiment the harmonic compensator is configured to determine the first and second control or compensator gains on basis of the information related to the determined first and second resonance frequencies.

In an embodiment the impedance detector is configured to distribute the information related to the determined resonance frequencies among different power generating units.

In an embodiment the distribution is performed depending on one or more of the following criteria: the loading of a power generating unit, the first and second resonance frequencies or a distance between the point of common coupling and a power generating unit.

A second aspect of the invention relates to a power generating unit for powering an electrical grid via a point of common coupling connection to the grid, where the power generating unit includes a power inverter for injecting current to the grid, the power generating unit includes,
- a harmonic compensator configured to determine control input to the inverter for controlling generation of active and reactive current by the inverter, where the control input is determined on basis of information related to a determined resonance frequency so that the current generated by the inverter is capable of compensating an electrical harmonic at the resonance frequency, wherein the harmonic compensator is configured to receive the resonance frequency from a power plant processor according to the third aspect below.

In an embodiment the unit is a wind turbine generator. Embodiments of the invention may be particularly useful for wind turbine generators since wind turbine generators may generate relatively high grid distortion due to use of power electronic converters.

A third aspect of the invention relates to a power plant processor for compensating an electrical harmonic of an electrical grid, where the electrical grid is powered by at least one power generating unit connected to a point of common coupling of the grid according to the second aspect, the power plant processor includes, an impedance detector configured to determine impedance peaks by repeatedly performing a scan of the impedance at the point of common coupling over a frequency range, and configured to determine a resonance frequency from one of the determined impedance peaks, wherein the power plant processor is configured to transmit the resonance frequency to the power generating unit.

A fourth aspect of the invention relates to a power plant installation including a power generating unit according to the second aspect and a power plant processor according to the third aspect.

A sixth aspect of the invention relates to a method for compensating an electrical harmonic on an electrical grid, where the electrical grid is powered by at least one power generating unit connected to a point of common coupling of the grid, which power generating unit includes a power inverter for injecting current to the grid, the method includes, determining impedance peaks by repeatedly performing a scan of the impedance at the point of common coupling over a frequency range, determining a resonance frequency from one of the determined impedance peaks, determining a control input to the inverter for controlling generation of active and reactive current generation by the inverter, where the control input is determined on basis of information related to the determined resonance frequency so that the current generated by the inverter is capable of compensating the electrical harmonic at the determined resonance frequency.

In summary the invention relates to a control system for compensating undesired electrical harmonics on an electrical grid. Part of the control system referred to as a harmonic compensator is operatively connected with a power inverter of a power producing unit supplying power to the grid. Another part of the control system, referred to as an impedance detector, is operatively connected to a point of coupling to which point one or more power producing units are connected. The impedance detector is configured to scan impedances as a function of frequency to identify frequencies of impedance peaks which peaks are indicative of resonance frequencies. The determined resonance frequencies are supplied to one or more the harmonic compensators. A compensator determines control signals to the inverter which causes the inverter to inject compensation currents to the grid which currents will damp currents oscillating at or close to the determined resonance frequency.

In general the various aspects of the invention may be combined and coupled in any way possible within the scope of the invention. These and other aspects, features and/or advantages of the invention will be apparent from and elucidated with reference to the embodiments described hereinafter.

BRIEF DESCRIPTION OF THE DRAWINGS

Embodiments of the invention will be described, by way of example only, with reference to the drawings, in which.

DETAILED DESCRIPTION OF AN EMBODIMENT

Figure 1:
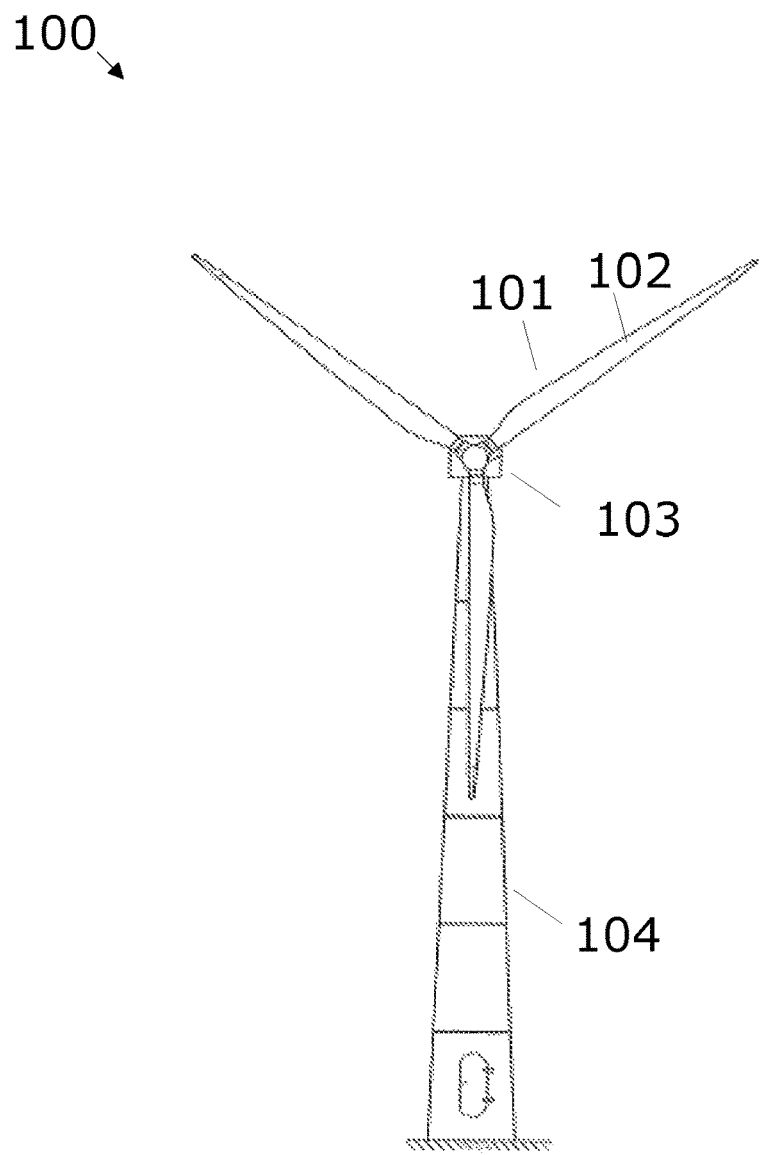
FIG. 1 shows a wind turbine generator 100.

FIG. 1 shows a wind turbine generator 100, hereafter also referred to as a WTG. The WTG 100 includes a rotor 101 for driving a shaft coupled to a power generator for generation of electric power from the wind driven rotor 101. A gearbox may connect a shaft of the rotor 101 to a shaft of the generator. Output power from the generator may be converted by a power converter, e.g. in frequency, before being supplied to a utility grid (electrical grid). The power converter includes an AC-to-DC converter and a DC-to-AC converter, the latter is referred to as an inverter 201 (see FIG. 2). The gear box, the generator and/or the power converter may be located in a nacelle 103. The nacelle 103 and rotor 101 is located on top of a tower 104. The WTG further includes a control system for controlling the inverter's 201 injection of active and reactive current to the utility grid and a harmonic compensator 210 for generating control input signals for the inverter so that the current injected by the inverter is capable of compensating electrical harmonics on the utility grid.

Figure 2:
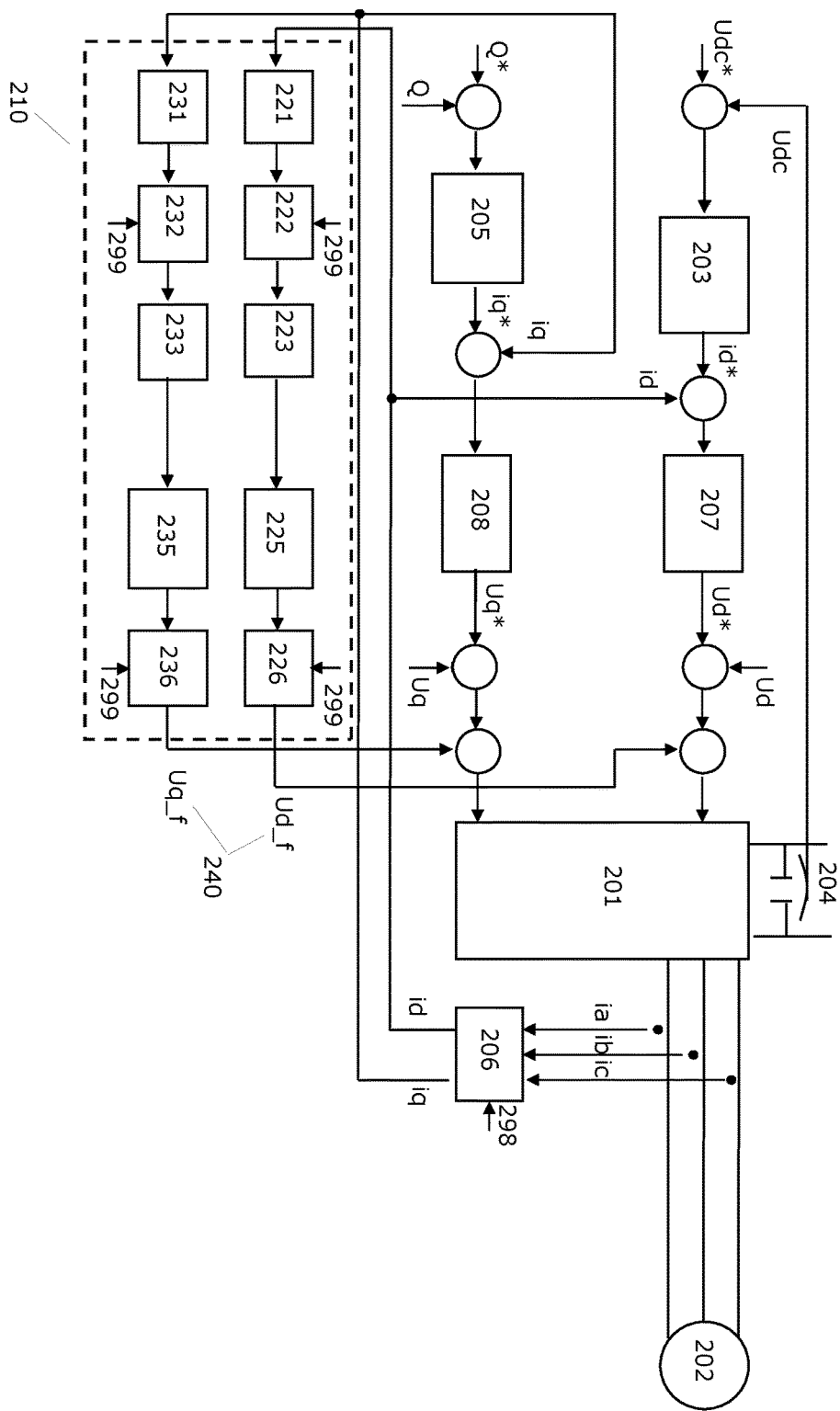
FIG. 2 shows a control system with an inverter 201 and a harmonic compensator 210 for a power generating unit.

FIG. 2 illustrates a principle for controlling an DC-to-AC inverter 201 in terms of the DC-link reference Udc* corresponding to the desired amount of active power delivered to the grid 202 or received from the grid, and in terms of the reactive power reference Q* corresponding to the desired amount of reactive power delivered to the grid 202 or received from the grid.

The difference between the DC-link reference Udc* and the DC-link voltage Udc measured from the DC-link capacitor 204 is supplied to a DC-link controller 203 which generates the active current reference id*.

Similarly, the difference between the reactive power reference Q* and the reactive power Q determined using voltage and currents measured at turbine terminals is supplied to a Q-controller 205 which generates the reactive current reference iq*.

The active current reference id* and the reactive current reference iq* are dq-frame parameters corresponding to parameters in a 3-phase system. Parameters such as current or voltage in a 3-phase system are time varying with the oscillation frequency, i.e. the frequency of the grid. Such time varying parameters may not be suited for control purposes. Therefore, the parameters in the 3-phase system is converted into time varying parameters in a 2-phase system represented in a stationary reference coordinate system and the parameters in the 2-phase system is converted into the dq-frame parameters represented in a rotating reference coordinate system (e.g. rotating with the frequency ω of the grid). In steady-state where the amplitudes of the parameters in the 3-phase system are constant, the dq-frame parameters are constant. Accordingly, three phases, e.g. three voltage oscillations, can be represented as two stationary parameters in the dq-frame. The stationary dq-frame parameters can be converted back into the time varying parameters in the 3-phase system by reversing the order of transformations described above. Equations for dq-frame transformations are well known and described in different books.

The measured output currents ia, ib, ic from the inverter 201 are converted via a dq-frame transformation by the dq-frame converter 206 to stationary currents id and iq corresponding to the currents ia, ib, ic. Thus, id corresponds to the active current of the output currents ia, ib, ic and iq corresponds to the reactive current of the output currents ia, ib, ic.

The difference between the active current reference id* and the measured active current reference id is supplied to the active current controller 207 which generates an active voltage reference Ud* which is supplied to the inverter 201. Thus, if the measured DC-link voltage Udc differs from the reference Udc* an active voltage reference Ud* is generated which controls the inverter 201 to reduce the DC-link voltage difference Udc*-Udc. It is noted that the DC-link controller can be implemented in other ways.

The difference between the reactive current reference iq* and the measured reactive current reference iq is supplied to the reactive current controller 208 which generates a reactive voltage reference Uq* which is supplied to the inverter 201. Thus, if the measured reactive power Q differs from the reactive power reference Q* a reactive voltage reference Ud* is generated which controls the inverter 201 to reduce the reactive power difference Q*-Q.

FIG. 2 shows the harmonic compensator 210 according to an embodiment of the invention. The measured active current id (in the dq-frame representation) is initially high-pass filtered in a high-pass filter 221 to remove harmonics below a given order, e.g. below an order of five, or any order determined by the resonating impedance peak detector. The high-pass filtered active current id is then dq transformed in by dq converter or transformer 222 where the rotating dq-reference frame rotates with a given frequency 299 being higher than the fundamental grid frequency ω. Here the frequency 299 of the dq transformation corresponds to the fifth harmonic, so that the output of the dq5 transformation is stationary for fifth harmonic oscillations (i.e. a steady-state fifth harmonic would be represented as a constant value). The dq transformed signal is low-pass filtered in a low-pass filter 223 to remove harmonics above a given order, e.g. above an order of five so that harmonics of six or higher are removed.

The low-pass filtered signal is provided as an input to a controller 225, e.g. a PI-controller, a P-controller or an I-controller configured to amplify and/or time-integrate the input signal. In principle, a difference between the low-pass filtered signal and a reference id_f is determined and inputted to the controller 225.

The output from the controller 225 is dq-transformed in a dq transformer 226 back to a rotating frame rotating with the fundamental grid frequency ω. The output from dq transformation 226 is the active voltage signal Ud_f and is added to active voltage reference Ud* so that the sum of signals is supplied to the inverter 201. Thus, if a fifth harmonic is present in the output currents ia, ib, is from the inverter 201 a non-zero active voltage Ud_f is generated which controls the inverter 201 to reduce the fifth harmonic.

The measured reactive current iq is high-pass filtered in a high-pass filter 231, dq-transformed by transformer 232, low-pass filtered by low pass filter 233, processed by a controller 235 and reverse dq transformed by dq transformation 236 back to original rotating dq-reference coordinate system rotating with the fundamental frequency ω of the grid similarly to the processing of the measured active current id as described above. The output from dq transformation 236 is the reactive voltage signal Uq_f which is added to the reactive voltage reference Uq* so that the sum of signals Uq_f and Uq* is supplied to the inverter 201.

Thus, the harmonic compensator 210 is configured to convert a harmonic of a given order of the active current signal id and the reactive current signal iq into respective stationary signals, i.e. signals which are stationary with respect to that given order. Additionally, the harmonic compensator is configured to process the stationary id and iq signals in controllers having a time-integrating effect on the stationary signals and/or having a proportional gain effect on the stationary signals. The harmonic compensator may further be configured to convert the output from the controllers back into dq-parameters which are stationary with respect to the fundamental frequency.

Consequently, the harmonic compensator 210 is configured to determine a control input 240 to the inverter 201 for controlling generation of active and reactive current generation by the inverter. The control input 240 includes the active voltage signal Ud_f and the reactive voltage signal Uq_f, i.e. signals generated by the harmonic compensator as described above. The control input 240 is determined on basis of the determined resonance frequency f by using the determined resonance frequency as the frequency of the dq transformation in dq transformers 221, 226, 231 and 236 of the harmonic compensator 201. For example, if the determined resonance frequency is the fifth harmonic a dq transformation corresponding to the fifth harmonic is utilised. The determined resonance frequency may further be used to determine the filter-order of the high-pass filters 221, 231 and low-pass filters 223, 233 so that the filter-order of the filters corresponds to the determined resonance frequency, i.e. the determined harmonic order. Thereby, the current generated by the inverter 210 is capable of compensating an electrical harmonic at a determined resonance frequency by injecting current in anti-phase with the electrical harmonic at the resonance frequency.

The harmonic compensator 210 is configured to determine the control input 240 based on processing of measured currents id and iq of the output of the inverter 210. This configuration of the harmonic compensator 210 includes dq-transformers 222, 232 for dq-transforming the measured currents id and iq to obtain a pair of active and reactive currents which are stationary in a dq-frame rotating with the determined resonance frequency. This configuration may further include controllers 225, 235 configured to time-integrate the dq-transformed currents outputted by dq-transformers 222, 232 and/or amplifying the dq-transformed currents by a control gain. Further, this configuration may include dq-transformers 226, 236 configured for dq-transforming the time-integrated and/or amplified currents back into a dq-frame rotating with a fundamental electrical frequency of the grid, e.g. 50 Hz of a 50 Hz grid.

Figure 3:
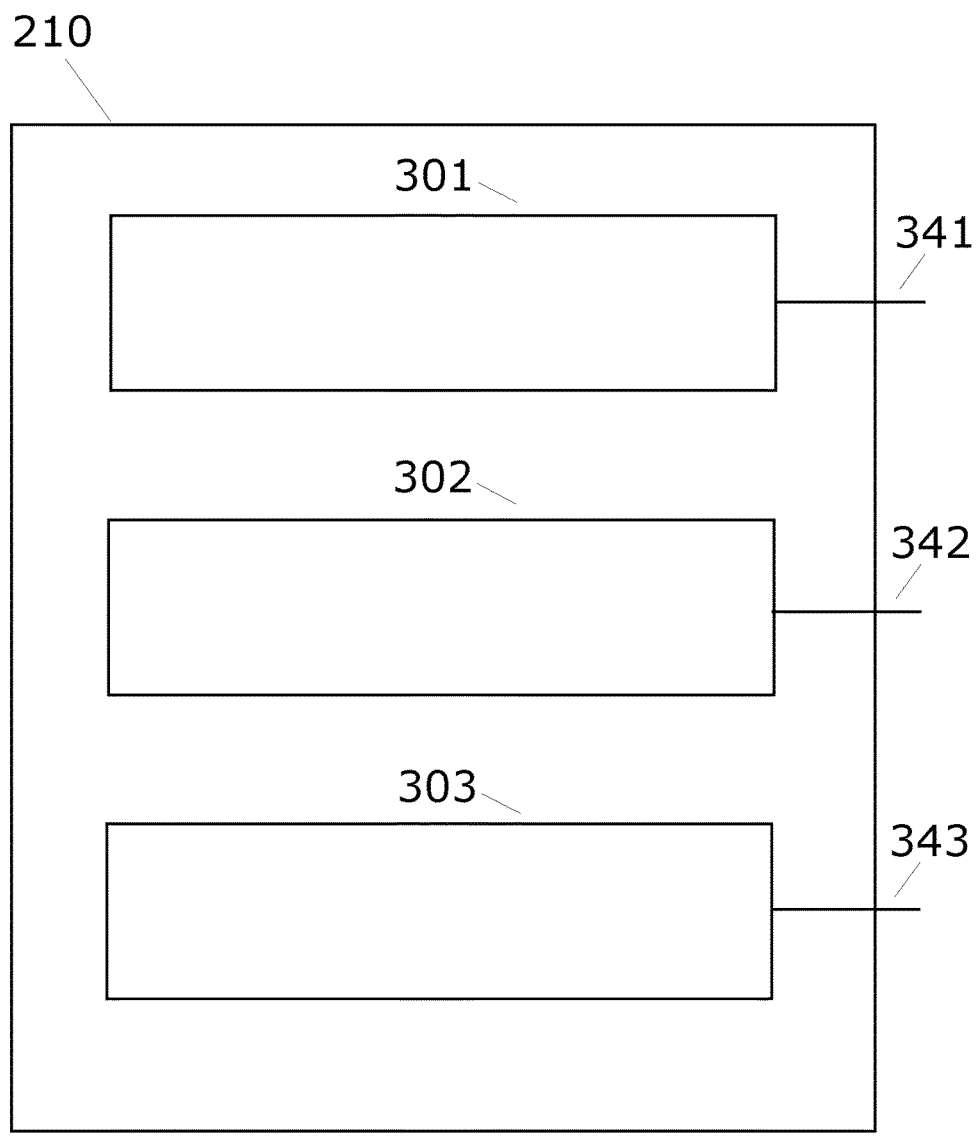
FIG. 3 shows a harmonic compensator 210 including two or more processors 301-303 for determining control input for the inverter 201.

FIG. 3 shows how the harmonic compensator 210 may be configured with a plurality of processing units 301-303 for compensating the electrical harmonics at a plurality of determined resonance frequencies by generating different control input 341-343. Each of the processing units 301-303 are configured similarly to the harmonic compensator 210 described in connection with FIG. 2, i.e. configured with a high-pass filter 221, 231 for filtering current signals id and iq, dq transformers 222, 232, low pass filter 223, 233, controllers 225, 235 for integrating and/or amplifying, and dq transformers 226, 236 for reverse dq transforming back to original rotating dq-reference coordinate system rotating with the fundamental frequency ω of the grid.

Each of processing units 301-303 are capable of generating a control input 240 to the inverter for controlling generation of active and reactive current based on measured currents of the inverter output similarly to the harmonic compensator 210 described in connection with FIG. 2. Accordingly, each of the processing units 301-303 receives measured currents of the inverter output, e.g. currents id and iq determined from dq transformed currents ia, ib and is as described in connection with FIG. 2, and each of the processing units 301 generates a control input 240, 341-343 for the inverter, where the control input 341-343 includes an active voltage signal (e.g. Ud_f) and a reactive voltage signal (e.g. Uq_f).

Thus, in order to enable compensation of different harmonics, the harmonic compensator 210 is configured to determine first and second control inputs 341, 342 (corresponding to control input 240) to the inverter for controlling generation of active and reactive current generation by the inverter 201, where the control inputs are determined depending on the determined first and second resonance frequencies tracked by the impedance peak detector so that the current generated by the inverter is capable of compensating the identified first and second electrical harmonics.

The harmonic compensator 210 may be configured to determine the control inputs 341-343 based on processing of measured currents of the inverter output, where the processing in each of the processing units 301-303 includes dq-transforming the measured currents by first and second dq-transforms to obtain first and second pairs of active and reactive currents which are stationary in dq-frames rotating with the determined first and second resonance frequencies. For that purpose, each of the processing units 301-303 may be configured with a pair of dq transformers equivalent to the dq transformers 222, 232 described in connection with FIG. 2. Each of the processing units 301-303 may further be configured with filters, similarly to the high pass and low pass filters 221, 223, 231, 233 described in connection with FIG. 2. Each of the processing units 301-303 may further be configured with a pair of controllers equivalent to the controllers 225, 235 described in connection with FIG. 2 in order to time-integrate and/or amplify the first and second pairs of active and reactive currents id, iq. It follows that each of the processing units 301-303 may further be configured with a pair of dq transformers—equivalent to the dq transformers 226, 236 described in connection with FIG. 2—for dq-transforming first and second pairs of active and reactive currents back into a dq-frame rotating with a fundamental electrical frequency of the grid.

Each of the processing units 301-303 may be configured to adapt the filters 221, 223, 231, 233 and dq-transformers 222, 226, 232, 236 on basis of the determined resonance frequencies 299 (the determination of resonance frequencies and supply of resonance frequencies to the harmonic compensator is described in connection with FIG. 5) so that each of the processing units 301-303 are adaptable to determine control inputs 341-343 for compensating harmonics at the determined resonance frequencies.

Alternatively or additionally, each of the processing units 301-303 may be configured with adaptive controllers 225, 235 having adaptable control gains which can be increased or decreased. Thus, by configuring the harmonic compensator 210 with different processing units 301-303 having filters 221, 223, 231, 233 and dq-transformers 222, 226, 232, 236 which are configured to filter and dq-transform at fixed frequencies (e.g. frequencies corresponding to a range of harmonics ranging e.g. from the first to the fiftieth harmonic), the amplitude of the adaptable gains can be adjusted so that gains of processing units 301-303 configured according to a given frequency corresponding the a determined resonance frequency are reduced, set to zero, or increased depending on the determined resonance frequencies.

Figure 4:
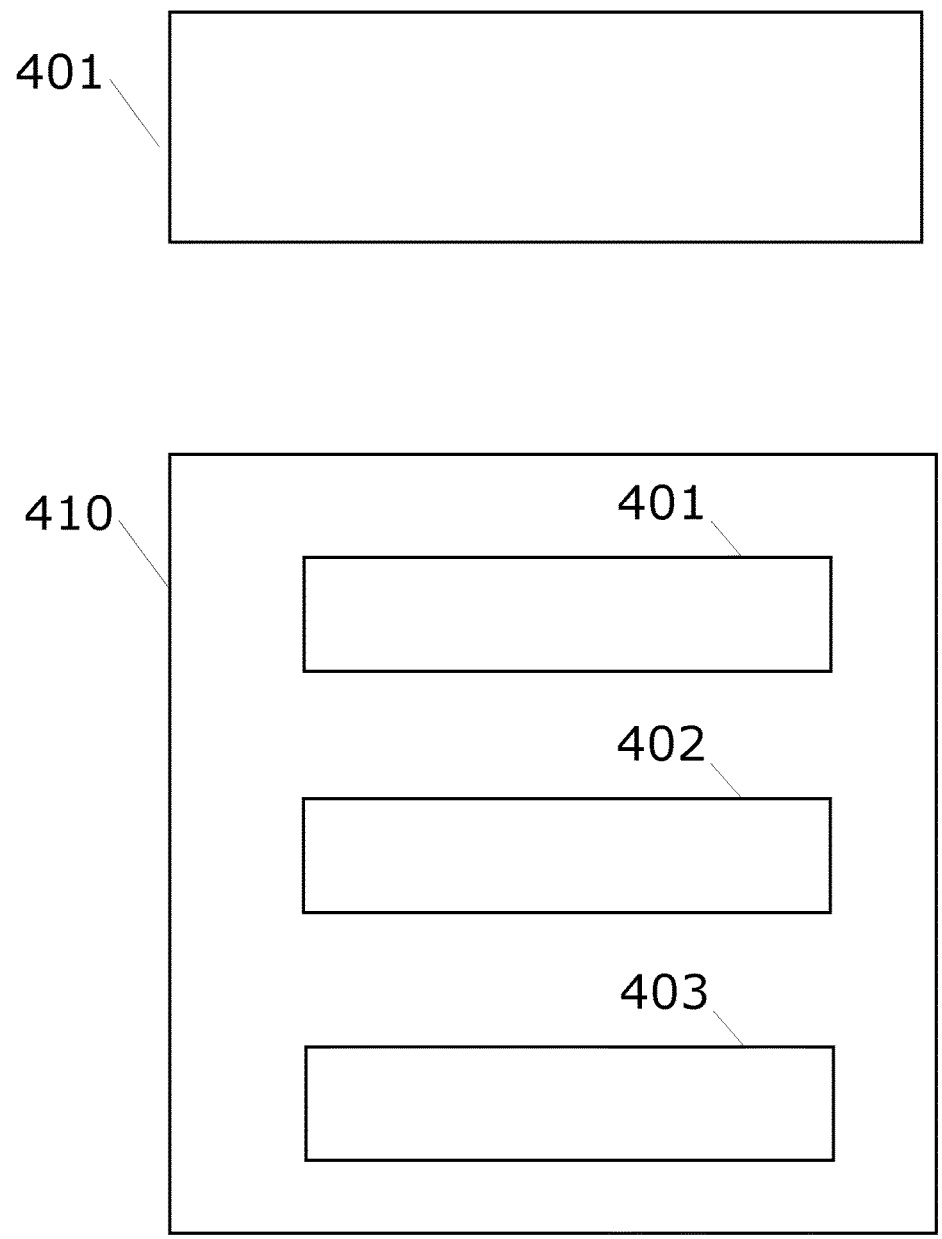
FIG. 4 shows a control system 401 including a harmonic compensator 410.

The control system and harmonic compensator 210 in FIG. 2 is known as a rotating frame controller. FIG. 4 illustrates an alternative control system including a fundamental controller 401 and a harmonic compensator 410. The fundamental controller 401 and harmonic compensator 410 are configured as proportional resonant controllers which does not utilize dq transformations since the control variables for the inverter 201 are sinusoidal. The fundamental controller 401 replaces the active and reactive current controllers 207, 208 in FIG. 2 and thereby receives that same input and generates the same outputs Ud* and Uq*.

The harmonic compensator 410 includes a plurality of processing units 401-403 for compensating the electrical harmonics at a plurality of determined resonance frequencies by generating different control input being similar to the control input 341-343 of FIG. 3. Each of the processing units 301-303 are configured with a transfer function of the form $(Kh*s)/(s*s+h*\omega*\omega)$, where Kh is the adaptable control gain for a harmonic h, h is the harmonic number, ω is the fundamental frequency and s is the Laplace variable.

Each of processing units 401-403 are capable of generating a control input 240 to the inverter 201 for controlling generation of active and reactive current based on measured currents of the inverter output similarly to the harmonic compensator 210. Accordingly, each of the processing units 401-403 receives measured currents of the inverter output, e.g. currents id and iq determined from dq transformed currents ia, ib and is as described in connection with FIG. 2, and each of the processing units 301 generates a control input 240 for the inverter. The control inputs 240 from the processing units 401-403 are summed before being supplied to the inverter 201.

Thus, in order to enable compensation of different harmonics, the harmonic compensator 410 may be configured to determine first and second control inputs to the inverter for controlling generation of active and reactive current generation by the inverter 201, where the control inputs are determined depending on the determined first and second resonance frequencies tracked by the impedance peak detector so that the current generated by the inverter is capable of compensating the identified first and second electrical harmonics.

The processing units 401-403 are configured with adaptable control gains Kh. Based on received impedance peak information from the impedance detector 510 (described below), the controller gains Kh for each of the identified impedance peaks can be adjusted e.g. based on gain values received from a look-up table so that harmonic compensation can be achieved. Thus, the harmonic compensator 410 is configured so that adaptable controller gains Kh can be adjusted depending on determined resonance frequencies to be compensated.

Principles of operation of the controller in FIG. 2 and the harmonic compensators 210, 410 are described in "Overview of Control and Grid Synchronization for Distributed Power Generation Systems, Frede Blaabjerg, Remus Teodorescu, Marco Liserre, and Adrian V. Timbus, IEEE Transactions on industrial electronics, vol. 53, no. 5, October 2006" which is hereby incorporated by reference.

Figure 5:
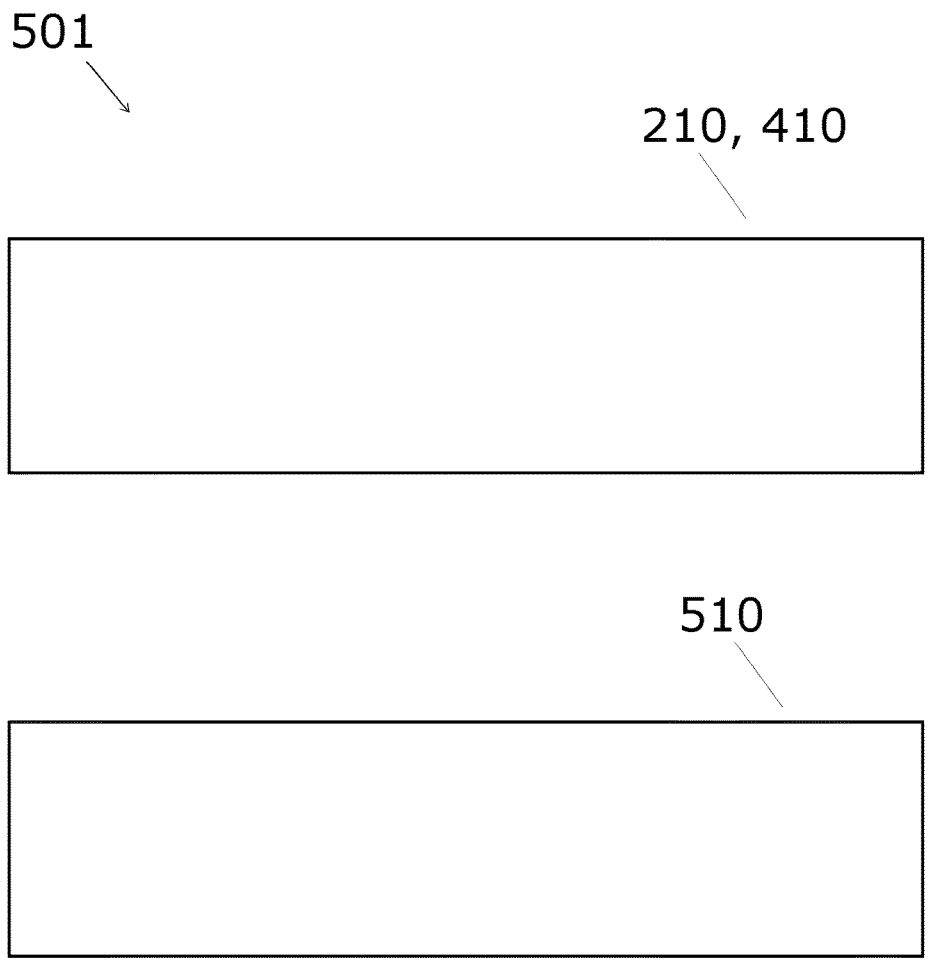
FIG. 5 shows a control system 501 including an impedance detector 510.
Figure 6:
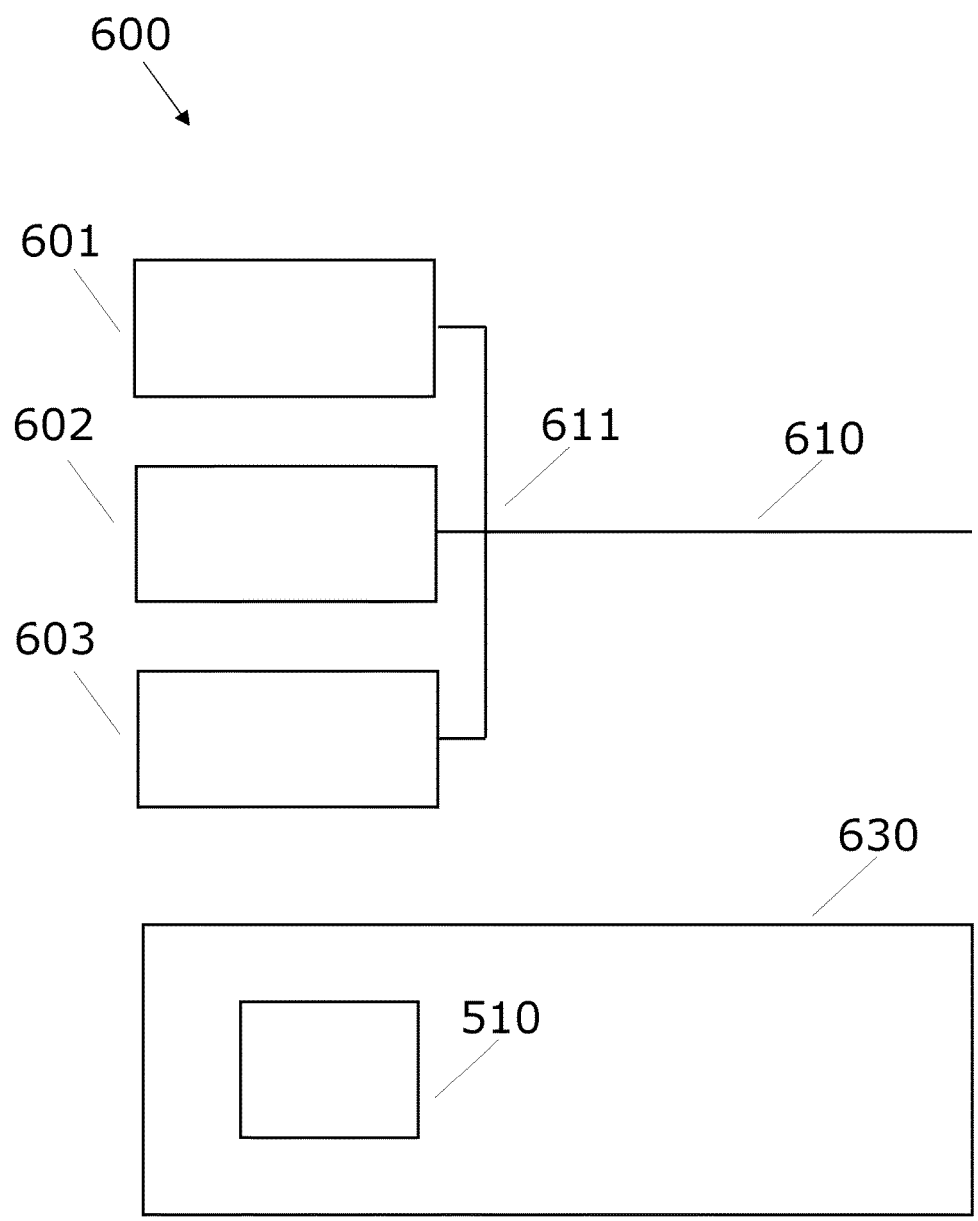
FIG. 6 shows a power plant installation 600 including one or more power generating units 601-603 connected to an electrical grid 610 via a point of common coupling 611.

FIG. 5 shows a control system 501 for compensating an electrical harmonic on an electrical grid powered by at least one power generating unit connected to an electrical grid via a point of common coupling 611 (see FIG. 6). The control system includes a harmonic compensator 210, 410 configured according to any of the described embodiments and an impedance detector 510 configured to determine a resonance frequency by repeatedly performing a scan of the impedance at the point of common coupling over a frequency range and determine the resonance frequency from impedance peaks determined by the scan. The point of common coupling may include any point of measurement to which one or more power generating units 100 are connected.

The scan of impedances may be performed for every period of time ranging from 10 seconds to 10 minutes. The scan of impedances may be performed with a step size of 0.5 Hz or any other suitable step size ranging from 0.1 Hz to 100 Hz, e.g. 50 Hz for a 50 Hz grid.

The impedance peaks may be determined by performing a FFT (Fast Fourier Transformation) of the voltage and current measured at the point of common coupling. The FFT measurements give the voltage and current magnitudes and corresponding phase angles for a plurality of frequencies. For example, the plurality of frequencies may include frequencies ranging from the fundamental grid frequency (e.g. 50 Hz) to the 50th harmonic (i.e. 2500 Hz) in step of 0.5 Hz. The impedance at one or more of the plurality of frequencies may be determined by dividing the vector voltage and vector current. For example the 5th harmonic impedance Z (i.e. the impedance at 250 Hz) can be calculated by dividing the vector voltage at 250 Hz with the vector current at 250 Hz as determined by the FFT measurements.

By analysing impedances at one or more of the plurality of frequencies, e.g. by determining peak values of the impedances it is possible to determine frequency locations showing the highest impedance peaks over the frequency scanning range. For example, the highest peaks may be determined by ranging the peaks according to the descending order of the peak magnitudes.

Accordingly, the impedance detector may determine one or more resonance frequencies such as first and second resonance frequencies from determined first and second impedance peaks.

Electrical resonances are likely to occur at the impedance peaks, particularly the highest impedance peaks. Accordingly, one or more resonance frequencies corresponding can be determined from a corresponding number of the one or highest impedance peaks.

A resonance peak may be determined by identifying impedances which are higher than impedances at neighbouring frequencies by a given percentage, e.g. 20%.

The impedance detector 510 is configured, by any known communication means such as wired or wireless transmission technologies, to transmit information relating to the determined resonance frequencies to the harmonic compensator 210, 410, the power generating unit 100 or other unit associated with the harmonic compensator so as to affect the harmonic compensator to compensate electrical harmonics at the determined resonance frequencies by injecting current with a compensating phase and with the frequency of the harmonic into the grid. In effect the inverter 201 injects current in anti-phase with possible currents at the determined resonance frequencies (present in the measured currents ia, ib, ic and thereby the dq-transformed currents id and iq in FIG. 2) so that possible electrical resonances (oscillating currents) at the determined resonance frequencies are damped, i.e. so that current injection by the inverter 201 at the resonance frequencies is minimised.

The information relating to the determined resonance frequencies which is transmitted by the impedance detector 510 may be the determined resonance frequencies themselves, information indicating the harmonic numbers to be compensated, or other information useable by the harmonic compensator 210, 410 for determining control input 240, 341-343 for compensating harmonics at certain resonance frequencies. The information relating to the determined resonance frequencies may be determined by the impedance detector or other processing unit before being transmitted by the impedance detector.

Accordingly, in general the harmonic compensator 210, 410 is configured to determine one or more control inputs to the inverter for controlling generation of active and reactive current generation by the inverter, where the control inputs are determined depending on the determined resonance frequencies so that the current generated by the inverter is capable of compensating the one or more electrical harmonics at the determined resonance frequencies. For example, the control inputs 240, 341-343 may be determined depending on resonance frequencies supplied by the impedance detector or depending on other information derived from the determined resonance frequencies such as harmonic numbers to be compensated.

For example, the one or more control input 341-343 to the inverter 201 may be determined by modifying the control gains of the processing units 301-303 on basis of the determined first and second resonance frequencies as described above for harmonic compensators configured with adaptive controllers 225, 235 having adaptable control gains. Thus, the harmonic compensator 210 may be configured to determine pairs of first and second control gains of first and second processors 301-302 depending on the determined first and second resonance frequencies. For example, if resonance frequencies corresponding to the sixth and seventh harmonics are determined to be the harmonics to be compensated, e.g. since the sixth and seventh harmonics show the largest impedance peaks, the control gains of processors 301-303 corresponding to the sixth and seventh harmonics may be increased whereas other control gains of other processors (associated with other harmonics) may be reduced or set to zero. For example, if 5 resonating peaks are identified, the impedance detector may be configured to give priority to each of the peaks and pass them to the harmonic compensator.

Based on the received impedance peak information, the controller gains for each of the identified peaks can be adjusted e.g. based on gain values received from a look-up table so that harmonic compensation can be achieved.

In another example, the one or more control inputs to the inverter may be determined dependent on the determined resonance frequencies by adapting the filters 221, 223, 231, 233 and dq-transformers 222, 226, 232, 236 dependent on the determined resonance frequencies as described above in connection with FIG. 3 so that each of the processing units 301-303 are adaptable to determine control inputs 341-343 for compensating harmonics at the determined resonance frequencies. For example, if resonance frequencies corresponding to the sixth and seventh harmonics are determined to be the harmonics to be compensated the adaptable filters and dq-transformers may be modified to perform dq-transformations according to sixth and seventh harmonics and perform filtering for filtering out sixth and seventh harmonics.

FIG. 6 shows a power plant installation 600 including one or more power generating units 601-603 connected to an electrical grid 610 via a point of common coupling 611 and including a power plant processor 630.

The power generating units 601-603 may be wind turbine generators, solar power generators, hydro-electric generators or other generators for powering the electrical grid. The power generating units include a power inverter 201 for injecting current to the grid 610 and a harmonic compensator 210 configured as described herein. The harmonic compensator 210, 410 is configured to receive the one or more resonance frequencies or information relating to the one or more resonance frequencies to be compensated from the power plant processor 530.

The power plant processor 630 processor includes an impedance detector 510 configured as described herein. The power plant processor 630 or the impedance detector 510 is configured to transmit the one or more resonance frequencies or information relating to the one or more resonance frequencies to be compensated to one or more of the power generating units 601-603 or associated harmonic compensators of the power generating units.

The impedance detector 510 may be configured to distribute the determined resonance frequencies or information relating to the determined resonance frequencies among different power generating units 601-603. For example, fourth and fifth harmonics to be compensated may be transmitted to a harmonic compensator of a first power generating unit 601 and sixth and seventh harmonics to be compensated may be transmitted to one or more other power generating units 602-603.

For example, the distribution of information relating to the determined resonance frequencies to be compensated may be distributed so that harmonics at the lowest determined resonance frequencies are supplied to power generating units located relatively close to the point of common coupling and so that harmonics at the higher determined resonance frequencies are supplied to power generating units located further away from the point of common coupling since cable capacitance has greater impact on the high frequencies.

Alternatively or additionally, the information relating to the determined resonance frequencies to be compensated may be distributed according to loading of the power generating units 601-603, i.e. on basis of how close the power generating unit is to produce it's nominal power, since lightly loaded power generating units may be able to contribute more to harmonic current compensation than fully loaded power producing units. Since higher frequency harmonics may demand more compensating capability than lower harmonics, the information relating to the highest harmonics to be compensated may be transmitted to the harmonic compensators of the power generating units that has the smallest power load.

Additionally or alternatively, the information relating to the determined resonance frequencies to be compensated may be distributed according to the type of the power generating units, the power ratings of the power generating units and the health of a power generating unit.

The information relating to the determined resonance frequencies may be distributed according to any of the above criteria to individual power generating units or to groups of power generating units, e.g. so that a number of power generating units receives a first range of harmonics to be compensated and another number of power generating units receives a second range of harmonics to be compensated.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

Figure 7:
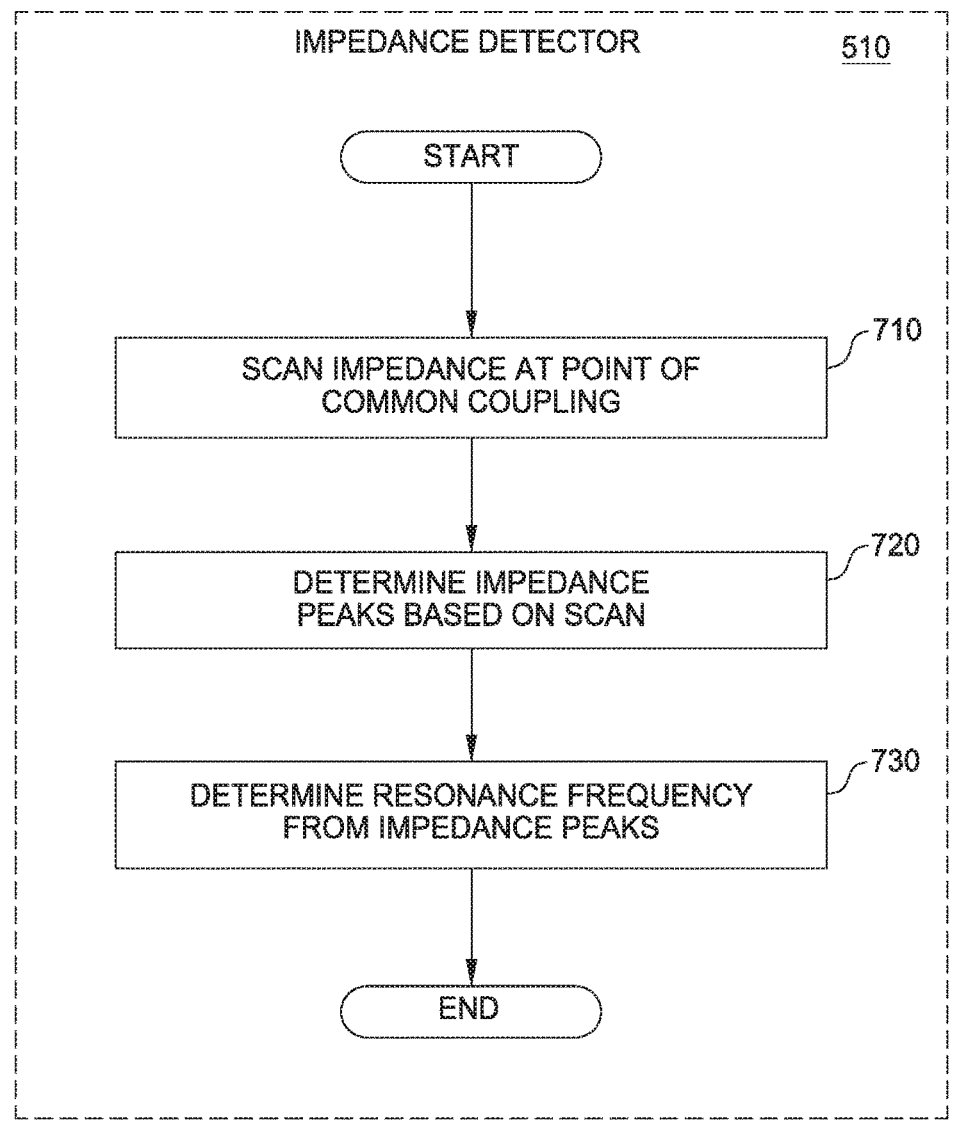
FIG. 7 shows an impedance detector 510.

FIG. 7 is a flow chart illustrating operation of an impedance detector 510, as described in relation to FIG. 5, above. At step 710, the impedance detector 510 repeatedly performs a scan of the impedance at the point of common coupling over a frequency range. At step 720, the impedance detector 510 determines impedance peaks from the scan. At step 730, the impedance detector 510 determines a resonance frequency from the impedance peaks.

What is claimed is:

1. A control system for compensating an electrical harmonic on an electrical grid, where the electrical grid is powered by at least one power generating unit connected to a point of common coupling of the grid, which power generating unit includes a power inverter for injecting current to the grid, the control system includes:
    an impedance detector configured to determine impedance peaks by repeatedly performing a scan of impedance at the point of common coupling over a frequency range, and configured to determine a resonance frequency from one of the determined impedance peaks, and
    a harmonic compensator configured to dynamically determine, based on the determined resonance frequency, a control input to the inverter for controlling generation of active and reactive current by the inverter, where the control input is determined so that the current generated by the inverter is capable of compensating the electrical harmonic at the determined resonance frequency, and wherein the harmonic compensator is configured to compensate a plurality of different electrical harmonics depending on the determined resonance frequency.

2. A control system according to claim 1, wherein the harmonic compensator includes a processor configured to determine the control input based on processing of measured currents of the inverter output, where the processing includes dq-transforming the measured currents to obtain a pair of active and reactive currents which are stationary in a dq-frame rotating with the determined resonance frequency.

3. A control system according to claim 2, wherein the processor is further configured to time-integrate the dq-transformed currents which are stationary in the dq-frame rotating with the determined resonance frequency and amplify the dq-transformed currents by a control gain.

4. A control system according to claim 3, wherein the processor is further configured to dq-transform the time-integrated and amplified currents back into a dq-frame rotating with a fundamental electrical frequency of the grid.

5. A control system according to claim 1, wherein
the impedance detector is configured to determine first and second resonance frequencies from determined first and second impedance peaks, and wherein
the harmonic compensator is configured to determine first and second control input to the inverter for controlling generation of active and reactive current generation by the inverter, where the control input are determined on basis of information related to the determined first and second resonance frequencies so that the current generated by the inverter is capable of compensating first and second electrical harmonics at the determined first and second resonance frequencies.

6. A control system according to claim 5, wherein the harmonic compensator includes first and second processors configured to determine the control inputs based on processing of measured currents of the inverter output, where the processing includes dq-transforming the measured currents by respective first and second dq-transforms to obtain respective first and second pairs of active and reactive currents which are stationary in dq-frames rotating with the determined respective first and second resonance frequencies.

7. A control system according to claim 6, wherein the first and second processors are configured to time-integrate the respective first and second pairs of active and reactive currents and amplify the first and second pairs of active and reactive currents by first and second control gains.

8. A control system according to claim 7, wherein the harmonic compensator is configured to determine the first and second control gains on basis of the information related to the determined first and second resonance frequencies.

9. A control system according to claim 5, wherein the impedance detector is configured to distribute the information related to the determined resonance frequencies among different power generating units.

10. A control system according to claim 9, wherein the distribution is performed depending on one or more of the following criteria: a loading of a power generating unit, the first and second resonance frequencies, or a distance between the point of common coupling and a power generating unit.

11. A power generating unit for powering an electrical grid via a common coupling point connection to the grid, where the power generating unit includes a power inverter for injecting current to the grid, the power generating unit includes:
a harmonic compensator configured to:
receive a resonance frequency from a power plant processor, the power plant processor comprising an impedance detector configured to determine impedance peaks by repeatedly performing a scan of impedance at the point of common coupling over a frequency range, and configured to determine the resonance frequency from one of the determined impedance peaks; and
dynamically determine, based on the received resonance frequency, a control input to the inverter for controlling generation of active and reactive current by the inverter, where the control input is determined so that the current generated by the inverter is capable of compensating an electrical harmonic at the resonance frequency, and wherein the harmonic compensator is configured to compensate a plurality of different electrical harmonics depending on the determined resonance frequency.

12. A power generating unit according to claim 11, wherein the power generating unit is a wind turbine generator.

13. A power plant installation including a power generating unit according to claim 11.

14. A method for compensating an electrical harmonic on an electrical grid, where the electrical grid is powered by at least one power generating unit connected to a point of common coupling of the grid, which power generating unit includes a power inverter for injecting current to the grid, the method includes:
determining impedance peaks by repeatedly performing a scan of impedance at the point of common coupling over a frequency range,
determining a resonance frequency from one of the determined impedance peaks, and
dynamically determining, based on the determined resonance frequency, a control input to the inverter for controlling generation of active and reactive current generation by the inverter, where the control input is determined so that the current generated by the inverter is capable of compensating the electrical harmonic at the determined resonance frequency, and wherein the determined control input is one of a plurality of possible control inputs to compensate a plurality of different electrical harmonics, depending on the determined resonance frequency.

* * * * *